United States Patent
Tang (10) Patent No.: US 7,842,546 B2
(45) Date of Patent: Nov. 30, 2010

(54) INTEGRATED CIRCUIT MODULE AND METHOD OF PACKAGING SAME

(75) Inventor: Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/827,211

(22) Filed: Jun. 30, 2010

(65) Prior Publication Data

US 2010/0267207 A1 Oct. 21, 2010

Related U.S. Application Data

(62) Division of application No. 12/323,780, filed on Nov. 26, 2008, now Pat. No. 7,772,694.

(51) Int. Cl.
*H01L 21/768* (2006.01)
*H01L 23/522* (2006.01)

(52) U.S. Cl. ............... 438/106; 257/664; 257/680; 257/686; 257/712; 257/713; 257/723; 257/728; 257/773; 257/E23.141; 257/E23.169; 257/E21.499

(58) Field of Classification Search ............... 257/664, 257/680, 686, 712, 713, 723, 728, 773, E23.141, 257/E23.169, E21.499; 438/106
See application file for complete search history.

(56) References Cited

U.S. PATENT DOCUMENTS

| | | | |
|---|---|---|---|
| 5,668,408 A | 9/1997 | Nicholson | |
| 5,912,598 A * | 6/1999 | Stones et al. | 333/26 |
| 6,028,497 A | 2/2000 | Allen et al. | |
| 6,040,739 A | 3/2000 | Wedeen et al. | |
| 6,265,774 B1 | 7/2001 | Sholley et al. | |
| 6,489,679 B2 | 12/2002 | Tsukiyama et al. | |
| 6,873,044 B2 | 3/2005 | Ammar | |
| 7,180,394 B2 * | 2/2007 | Ammar et al. | 333/247 |
| 7,285,865 B2 | 10/2007 | Kwon et al. | |
| 2007/0273008 A1 | 11/2007 | Suzuki | |

* cited by examiner

Primary Examiner—Eugene Lee
Assistant Examiner—Peniel M Gumedzoe
(74) Attorney, Agent, or Firm—Meschkow & Gresham, P.L.C.

(57) ABSTRACT

An integrated circuit (IC) module (20) includes a ground plane (22) having adjoining cutouts (30, 32). The cutout (32) defines a critical signal pathway (38). A device (24) is positioned in the cutout (30) and a device (26) is positioned outside of the cutout (30) adjacent to the cutout (32). An electrical interconnect (56) positioned in the critical signal pathway (38) interconnects the device (24) with the device (26). A method (60) of packaging the IC module (20) entails encapsulating the ground plane (22) and devices (24, 26) in a packaging material, and forming conductive vias (92) in the packaging material (84) that extend between the ground plane (22) and an exterior surface (94) of the packaging material (84). The conductive vias (92) surround the device (24) and cutout (32) to protect again electromagnetic interference and to provide guided signal pathways for high frequency signals on electrical interconnect (56).

20 Claims, 6 Drawing Sheets

INTEGRATED CIRCUIT MODULE AND METHOD OF PACKAGING SAME

RELATED INVENTION

The present invention is a divisional of "Integrated Circuit Module and Method of Packaging Same," U.S. patent application Ser. No. 12/323,780, filed 26 Nov. 2008, which is incorporated in its entirety by reference herein.

TECHNICAL FIELD OF THE INVENTION

The present invention relates generally to integrated circuit packages. More specifically, the present invention relates to an integrated circuit module and packaging methodology for high frequency device integration.

BACKGROUND OF THE INVENTION

There is a continually increasing demand for radar sensors, wireless telecommunications systems, and the like that call for high frequency integrated circuit (IC) modules. Such modules include, for example, millimeter wave devices, microwave devices, radio frequency wave devices, and the like. The packaging of such modules has a significant effect on their function, their reliability, and the size of end-user devices into which the high frequency IC modules are integrated. For example, the packaging of a high frequency IC module should protect individual devices within the module from interfering with one another, protect transmission lines from interfering with one another and with surrounding devices, and reject electromagnetic interference from external sources. In addition, the packaging should protect the IC module from environmental factors and allow coupling external to the IC module as needed.

IC packaging has evolved through multiple types of packaging technologies. One such packaging technology is known as chips-first packaging. In chips-first packaging, the IC device or devices are at least partially encapsulated in a molding compound. The IC device or devices are then mounted to an inert substrate with their active surfaces face up. Interconnect circuitry can then be built above the active surface of the IC dies. The interconnect circuitry may be formed to the IC device as an integral part of the processing, thus eliminating the need for wire bonds, tape-automated bonds (TABs), solder bumps, or traditional substrate (leadframe or package substrate). Accordingly this packaging technique can support high density interconnect routing, more functionality, and can improve power efficiency, while concurrently facilitating miniaturization, increasing yield, and decreasing cost.

The packaging of high frequency IC modules has been problematic because the individual devices in such an IC module may not be adequately protected from electrical interference and the high frequency transmission lines may not be adequately shielded. These problems are exacerbated with packaging technologies that provide high density interconnect routing and are intended to miniaturize devices, such as chips-first packaging. Accordingly, what is needed is a high-frequency IC module and a method for effectively packaging high-frequency IC devices to form the high-frequency IC module. Such a module and methodology should address signal integrity and electromagnetic interference needs. Furthermore, the methodology should mitigate problems with manufacturing precision and repeatability, while concurrently increasing yields, minimizing size, and minimizing manufacturing costs.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Embodiments of the invention include an integrated circuit (IC) module having one or more high frequency devices integrated therein and a method for packaging an IC module that includes one or more high frequency devices. In an embodiment, a high frequency device may be a device operating at millimeter wave, microwave, or radiofrequency wave frequencies that is suited for incorporation in various radar systems, telecommunications systems, and the like. The methodology employs a relatively low cost chips-first packaging technology that incorporates a ground plane and various structures that protect against electromagnetic interference and that provide guided signal paths for high frequency signals so as to enhance performance of the IC module relative to prior devices.

Figure 1:
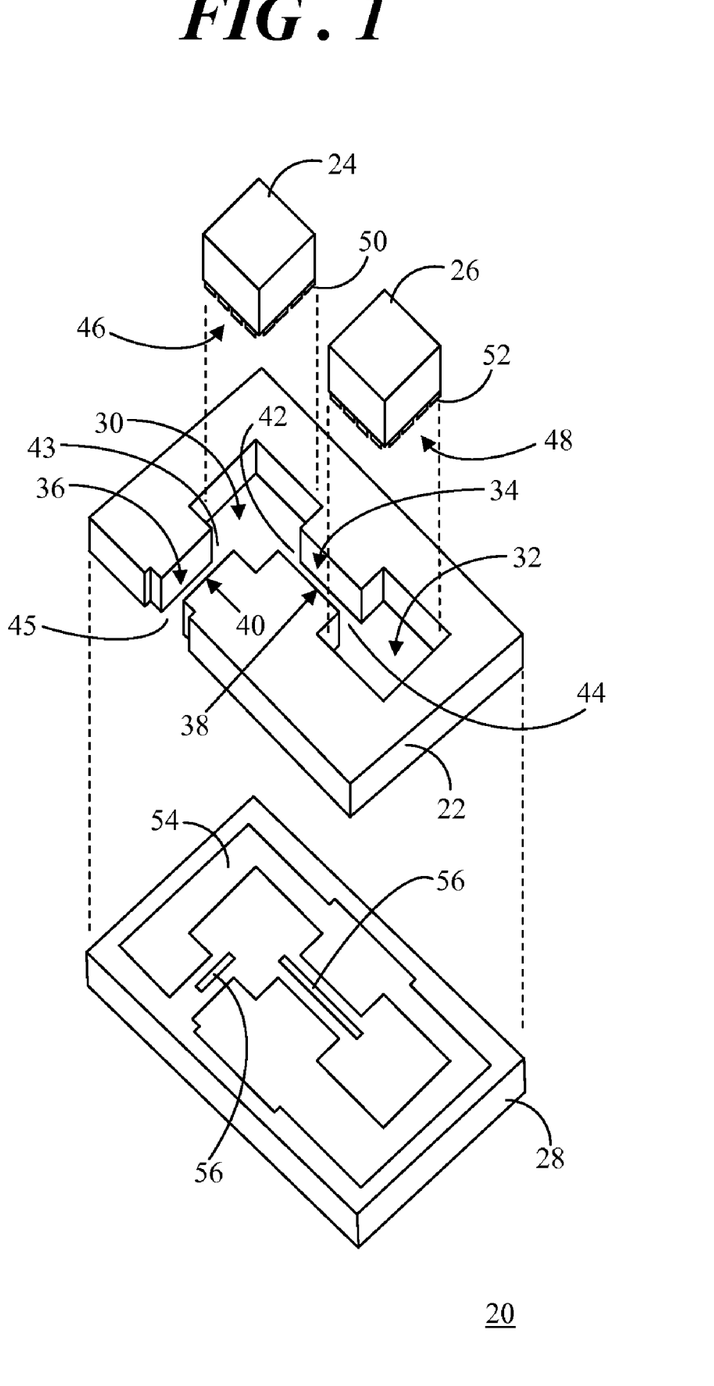
FIG. 1 shows an exploded perspective view of an integrated circuit (IC) module in accordance with an embodiment of the invention.

FIG. 1 shows an exploded perspective view of an integrated circuit (IC) module 20 in accordance with an embodiment of the invention. IC module 20 generally includes a ground plane 22, a device 24, a device 26, and build-up layers 28.

As will be discussed in greater detail below, ground plane 22 is an electrically conductive surface, e.g., copper, that can be used to improve the propagation of signals along critical signal pathways and provide a common ground reference for current returns of the various circuit elements of IC module 20, such as devices 24 and 26, as well as provide shielding. In particular, electrical signals operating at high frequencies emit electric fields from their associated signals paths which can couple to and affect neighboring signals. The structure of ground plane 22 can facilitate control of the impedance presented to a signal propagating along an electrical interconnect (discussed below), thereby reducing crosstalk and reflections.

Ground plane 22 may also be referred to herein as an embedded ground plane 22 because ground plane 22 is embedded, or implanted, within an encapsulant, as described in connection with an IC module packaging process shown in FIG. 2.

In an embodiment, ground plane 22 includes a device cutout 30 and a device cutout 32. Ground plane 22 further includes a transmission line cutout 34 and another transmission line cutout 36. Device 24 is positioned in device cutout 30 and device 26 is positioned in device cutout 32. Transmission line cutouts 34 and 36 define critical signal pathways 38, 40 in which electrical interconnects (discussed below) may be positioned. For example, transmission line cutout 34 includes an end 42 adjoining device cutout 30 and an end 44 adjoining device cutout 32. Likewise, transmission line cutout 36 includes an end 43 adjoining device cutout 34 and an end 45 that does not adjoin a cutout. An electrical interconnect may be positioned in transmission line cutout 34 and interconnect device 24 with device 26. This interconnection will be discussed in substantially greater detail below.

Device 24 may be an active device or a passive device designed and built for a particular function of IC module 20. Similarly, device 26 may be an active device or a passive device designed and built for a particular function of IC module 20. Generally, an active device is one that produces energy or is capable of power gain. Active devices include, for example, voltage sources, current sources, and the like. Conversely, a passive device refers generally to a component that consumes, but does not produce energy, or to a component that is incapable of power gain. Passive devices include, for example, transistors, resistors, capacitors, input/output elements, and other dissipative and energy-neutral components. Note that devices 24 and 26 may also be referred to as semiconductor die or dies.

In accordance with an embodiment, device 24 and/or device 26 may be a device operating at millimeter wave, microwave, or radiofrequency wave frequencies. Such devices can be interconnected with one another or with input/output elements via electrical interconnects. One or both of devices 24 and 26 may emit electromagnetic radiation which can interfere with the other of devices 24 and 26 or other devices in IC module 20 (not shown). Alternatively, one or both of devices 24 and 26 may be subject to electromagnetic interference from other external sources. The packaging methodology of an embodiment of the invention results in IC module 20 in which devices 24 and 26 are protected from interference.

As illustrated in FIG. 1, both of devices 24 and 26 are positioned in their respective device cutouts 30 and 32. However, in an alternative embodiment, only one of devices 24 and 26 may be positioned within a device cutout of ground plane 22. For example, if device 24 may be an active device operating at millimeter wave, microwave, or radiofrequency wave frequencies, thus calling for positioning within a device cutout. However, device 26 may be a passive device such as an input/output element which need not be positioned within a device cutout of ground plane 22, but is positioned adjacent to an end of a transmission line cutout. By way of example, in the illustrated embodiment, device 24 may be positioned in device cutout 30 and another device (not shown) may be positioned outside of device cutout 30 adjacent to end 45 of transmission line cutout 36.

In an embodiment, device 24 includes an active surface 46 and device 26 includes an active surface 48. Active surfaces 46 and 48 refer to that side of respective devices 24 and 26 having conductive pads (also referred to as bond pads, contacts, surface contacts, and so forth). As such, active surface 46 of device 24 includes conductive pads 50 and active surface 48 of device 26 includes conductive pads 52. Conductive pads 50 and 52 are utilized to electrically interconnect respective devices 24 and 26 to one another, to external sources, to input/output elements, and the like.

Conductive pads 50 and 52 may also be employed to interconnect respective devices 24 and 26 to the underlying build-up layers 28. Build-up layers 28 may include one or more dielectric layers and one or more overlying circuit metal layers within which traces may be formed. In addition, via-holes may be formed by patterning and etching the one or more dielectric layers. The via-holes are then filled with a conductive material to form vias (not shown) that may be used to interconnect with contacts or traces in the overlying circuit metal layers (not shown). The resulting package of IC module 20 including build-up layers 28 is sometimes referred to as a redistributed chip package (RCP) because the interconnects are routed or redistributed among the one or more layers within build-up layers 28 to minimize the area of the package. Consequently, with some embodiments no wirebonding or traditional substrate (leadframe or package substrate) is needed to form a RCP thus increasing yield and decreasing cost.

In accordance with an embodiment of the invention, build-up layers 28 include a metallization layer 54 and electrical interconnects 56. Electrical interconnects 56 may be utilized to interconnect device 24 with device 26 via their respective conductive pads 50 and 52. Alternatively, electrical interconnects 56 may be utilized to interconnect device 24 and/or device 26 with the traces and/or conductive vias of build-up layers 28. Metallization layer 54 and electrical interconnects 56 are formed concurrently during the formation of build-up layers 28 in accordance with the IC packaging process of FIG. 2.

It should be understood that IC module 20 and the particular components of IC module 20 are presented for illustrative purposes. Those skilled in the art will recognize the IC module 20 can take many forms and can include more or less devices than those shown. An embodiment of the invention entails a method of packaging IC module 20 so as to improve the signal line performance of IC module relative to prior art devices. Such packaging methodology is especially useful when packaging high frequency devices in miniaturized form.

Figure 2:
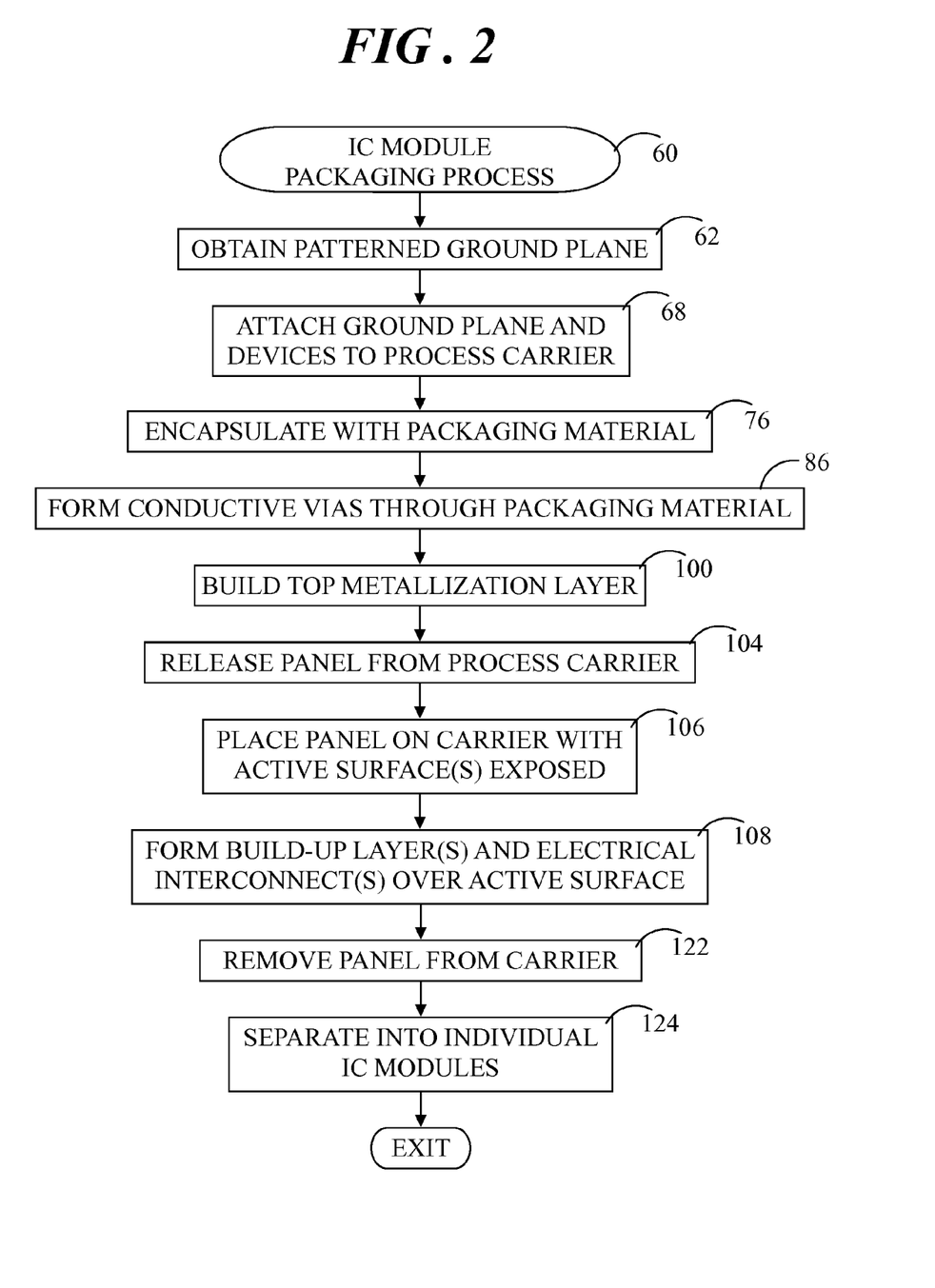
FIG. 2 shows a flowchart of an IC module packaging process in accordance with another embodiment of the invention.

FIG. 2 shows a flowchart of an IC module packaging process 60 in accordance with another embodiment of the invention. IC die packaging process 60 describes a chips-first packaging methodology that entails the encapsulation of devices 24 and 26 (FIG. 1) as well as ground plane 22 (FIG. 1) followed by the formation of build-up layers 28 to produce IC module 20. Process 60 is discussed in connection with the packaging of a single IC module 20. However, the invention applies equally to the concurrent packaging of multiple IC modules 20.

IC module packaging process 60 begins with a task 62. At task 62, ground plane 22 is obtained. In an embodiment, a manufacturing facility performing the packaging of IC module 20 may fabricate ground plane 22. Alternatively, the manufacturing facility may obtain ground plane 22 from an external source.

Figure 3:
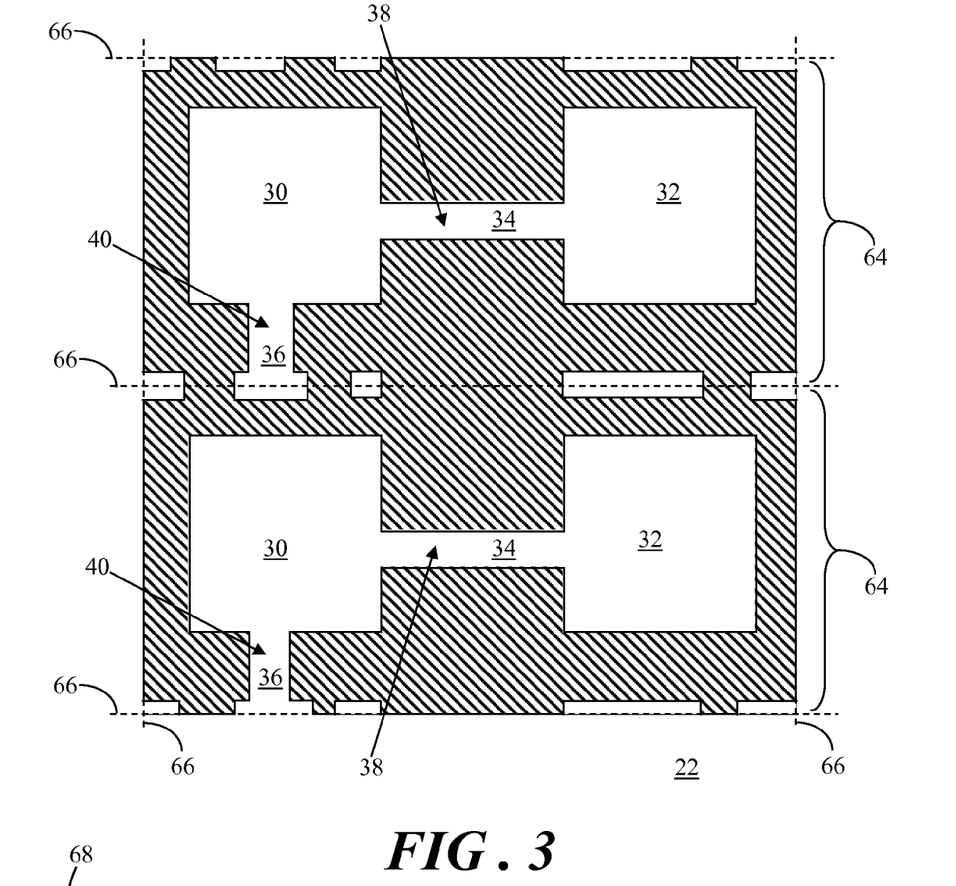
FIG. 3 shows a top view of a ground plane incorporated into the IC module during packaging thereof.

Referring to FIG. 3 in connection with task 62, FIG. 3 shows a top view of ground plane 22 incorporated into IC module 20 (FIG. 1) during packaging thereof. Ground plane 22 may be manufactured from a conductive sheet, such as copper, of substantial size so that multiple discrete ground planes 22 can be obtained for the concurrent manufacture of multiple IC modules 20. Ground plane 22 is designed and pre-patterned with device cutouts 30 and 32 for placement of devices 24 and 26 (FIG. 1) and with transmission line cutouts 34 and 36 that define critical signal pathways 38 and 40 for electrical interconnects 56 (FIG. 1). In this illustration, two portions 64 of a larger ground plane 22 are distinguished by their surrounding dashed lines 66. Dashed lines 66 represent dicing lines of the larger ground plane 22. Through the packaging operations of process 60, a panel of IC modules 20 is formed. This panel of IC modules 20 will eventually be separated in accordance with dicing lines 66 to form a number of individual IC modules 20.

With reference back FIG. 2, following task 62, IC module packaging process 60 continues with a task 68. At task 68, ground plane 22, device 24, and device 26 are attached to a process carrier.

Figure 4:
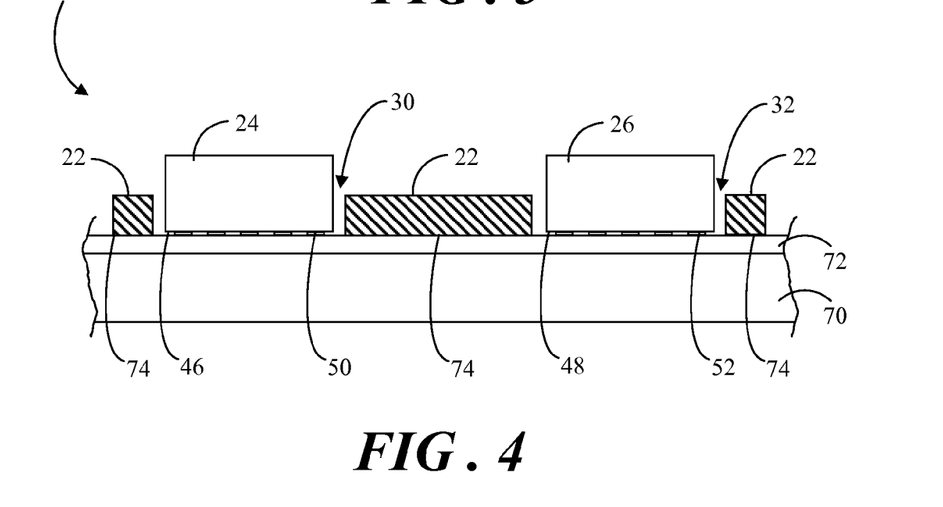
FIG. 4 shows a cross-sectional side view of a portion of a panel at a beginning stage of packaging in accordance with the IC module packaging process of FIG. 2.

Referring to FIG. 4 in connection with task 68, FIG. 4 shows a cross-sectional side view of a portion of a panel 68 at a beginning stage of packaging in accordance with IC module packaging process 60. Panel 68 includes a portion of a process carrier 70 having an adhesive 72 attached thereto. In one embodiment, adhesive 72 is a double-sided tape. Panel 68 may be formed by attaching ground plane 22, device 24, and device 26 to adhesive 72 on process carrier 70. By way of example, a surface, referred to hereinafter as an outer surface 74, of ground plane 22 is attached to adhesive 72. Additionally, devices 24 and 26 are placed on process carrier 70 within devices cutouts 30 and 32 with their corresponding active surfaces 46 and 48 face down on adhesive 72.

Devices cutouts 30 and 32 are sized to be only slightly larger than devices 24 and 26 so as to limit the drifting, or movement, of devices 24 and 26 during subsequent processing operations. In an embodiment, panel 68 includes a plurality of devices 24 and 26. However, only two devices, i.e., devices 24 and 26, are shown for simplicity of illustration. These devices 24 and 26 may be devices that have previously passed testing requirements, such as electrical, mechanical, or both (i.e., they are known good die).

With reference back FIG. 2, following task 68, IC module packaging process 60 continues with a task 76. At task 76, panel 68 is encapsulated with a packaging material.

Figure 5:
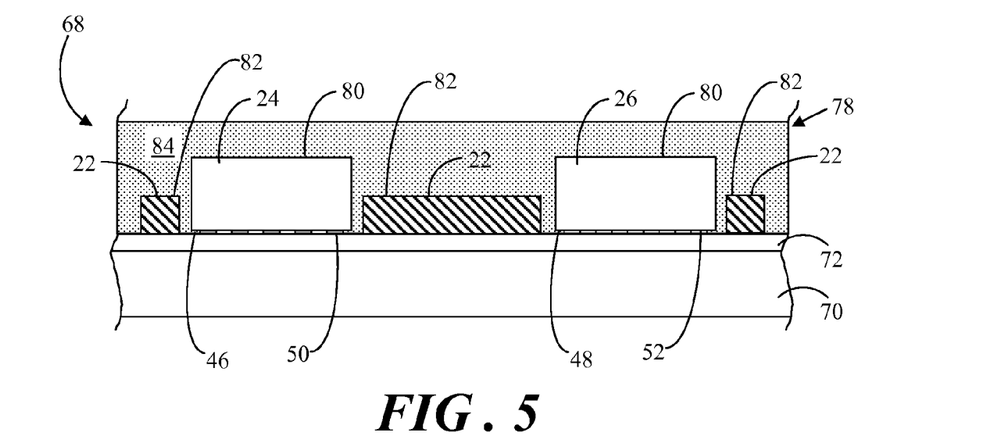
FIG. 5 shows a cross-sectional side view of the panel shown in FIG. 4 further along in processing.

Referring now to FIG. 5 in connection with task 76, FIG. 5 shows a cross-sectional side view of panel 68 shown in FIG. 4 further along in processing. An encapsulating layer 78 is formed over back sides 80 of devices 24 and 26 and over a surface, referred to hereinafter as an inner surface 82 of ground plane 22. In one embodiment encapsulating layer 78 is a dielectric (or insulating) packaging material 84 such as, for example, a spun-on polymer or a molding material that may be applied using any suitable process. Alternatively, encapsulating layer 78 may be any commercially available encapsulant packaging material 84 such as, for example, an epoxy-based and heat curable encapsulant. Because adhesive 72 is in contact with active surfaces 46 and 48 of devices 24 and 26, packaging material 84 encapsulates the remaining (five) sides of each of devices 24 and 26. In the embodiment shown, the five sides of each of devices 24 and 26 that are in contact with packaging material 84 includes all sides of devices 24 and 26 except active surfaces 46 and 48 having respective conductive pads 50 and 52. Hence encapsulating layer 78 is formed over and adjacent the sides of each of devices 24 and 26, as well as over and adjacent inner surface 82 of ground plane 22.

With reference back FIG. 2, following task 76, IC module packaging process 60 continues with a task 86. At task 86, conductive vias are formed through packaging material 84 of encapsulating layer 78.

Figure 6:
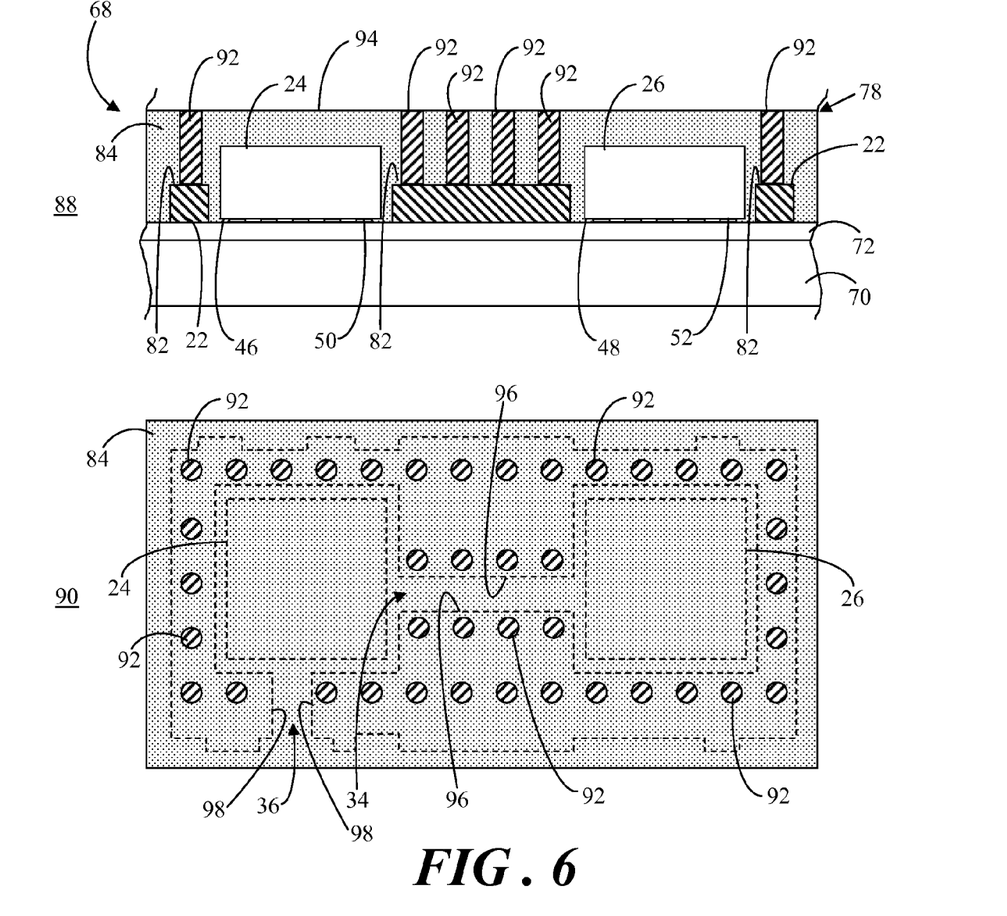
FIG. 6 shows a cross-sectional side view and a top view of the panel shown in FIG. 5 further along in processing.

Referring to FIG. 6 in connection with task 86, FIG. 6 shows a cross-sectional side view 88 and a top view 90 of panel 68 shown in FIG. 5 further along in processing. It should be noted in top view 90 that packaging material 84 entirely covers ground plane 22 and devices 24 and 26. Accordingly, ground plane 22 and devices 24 and 26 are illustrated in ghost form to represent their location within panel 68.

After encapsulation, via-holes are formed by, for example, patterning and etching packaging material 84 of encapsulating layer 78. The via-holes are then filled with a conductive material, such as copper, to form a plurality of vias 92. Accordingly, vias 92 refer to conductor-filled via-holes, which are referred to hereinafter as conductive vias 92. The conductive material can be deposited using any suitable process (e.g., chemical vapor deposition (CVD), atomic layer deposition (ALD), plating, and the like) to fill the via-holes.

In an embodiment, conductive vias 92 extend between inner surface 82 of ground plane 22 and an exterior surface 94 of packaging material 84. Furthermore, some of conductive vias 92 are aligned on opposing longitudinal sides 96 of transmission cutout 34. Some of conductive vias 92 may also be aligned on opposing longitudinal sides 98 of transmission cutout 36. Still others of conductive vias 92 may be formed in packaging material 84 surrounding devices 24 and 26. Conductive vias 92 function as a shield between devices 24 and 26 and between critical signal traces, such as electrical interconnections 56 (FIG. 1). Thus, conductive vias 92 in cooperation with ground plane 22 are used for internal electrical partition of IC module 20 and for guiding critical high frequency signals via critical signal pathways 38 and 40 (FIG. 1).

With reference back FIG. 2, following task 86, IC module packaging process 60 continues with a task 100. At task 100, a top metallization layer may be built on exterior surface 94 of packaging material 84.

Figure 7:
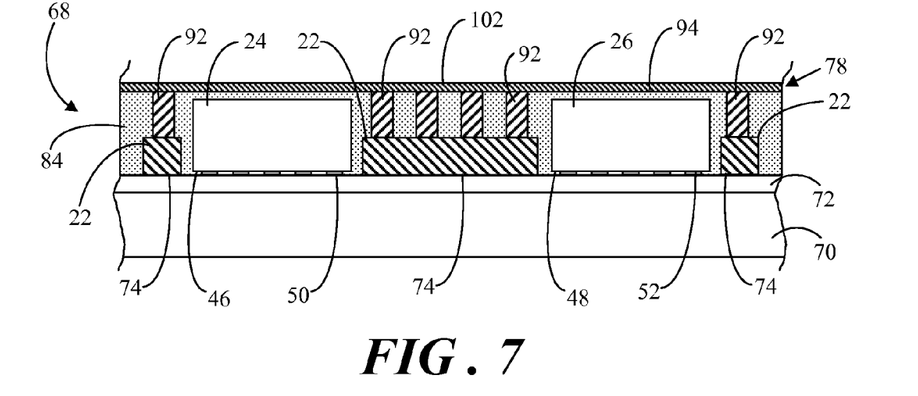
FIG. 7 shows a cross-sectional side view of the panel shown in FIG. 6 further along in processing.

Referring to FIG. 7 in connection with task 100, FIG. 7 shows a cross-sectional side view of panel 68 shown in FIG. 6 further along in processing. In an embodiment, following formation of conductive vias 92, packaging material 84 including conductive vias 92, may be thinned and planarized. Next, a top metallization layer 102 is built on exterior surface 94 of packaging material 84. Top metallization layer 102 is a conductive material, such as copper, that can be deposited on exterior surface 94 using any suitable process. Top metallization layer 102 electrically couples to ground plane 22 via conductive vias 92. Thus, top metallization layer 102 functions to further protect devices 24 and 26 and electrical interconnects 56 (FIG. 1) from external electromagnetic interference and/or to protect external devices from electromagnetic radiation emitted from devices 24 and 26 and electrical interconnects 56. Although the deposition of top metallization layer 102 is discussed in task 100 of process 60 that is separate from task 86 associated with forming conductive vias 92, it should be understood that these operations may occur concurrently. For example, conductive material can be deposited using any suitable process that both fills the via-holes and leaves a remaining material layer on exterior surface 94 of packaging material 84 to form metallization layer 102.

With continued reference to FIGS. 2 and 7, following task 100, IC module packaging process 60 continues with a task 104. At task 104, panel 68 is released from process carrier 70. For example, adhesive 72 is removed using any process, such as heat (e.g., UV light), a solvent, and/or the like. After adhesive 72 is removed, panel 68 is flipped over so that outer surface 74 of ground plane 22 is exposed out of packaging material 84. In addition, conductive pads 50 on active surface 46 of device 24 and conductive pads 52 on active surface 48 of device 26 are exposed out of packaging material 84.

IC module packaging process 60 continues with a task 106. At task 106, the flipped panel 68 may be placed on another carrier with outer surface 74 of ground plane 22, active surface 46 of device 24, and active surface 48 of device 26 exposed. Conductive pads 50 and 52 may then be cleaned per conventional processes.

Next, a task 108 is performed. At task 108, build-up layers 28 (FIG. 1) and electrical interconnects 56 (FIG. 1) are formed over the exposed outer surface 74 of ground plane 22, active surface 46 of device 24 and active surface 48 of device 26. In one embodiment, a first layer of build-up layers 28 may be the formation of a metallization layer overlying outer surface 74 of ground plane 22.

Figure 8:
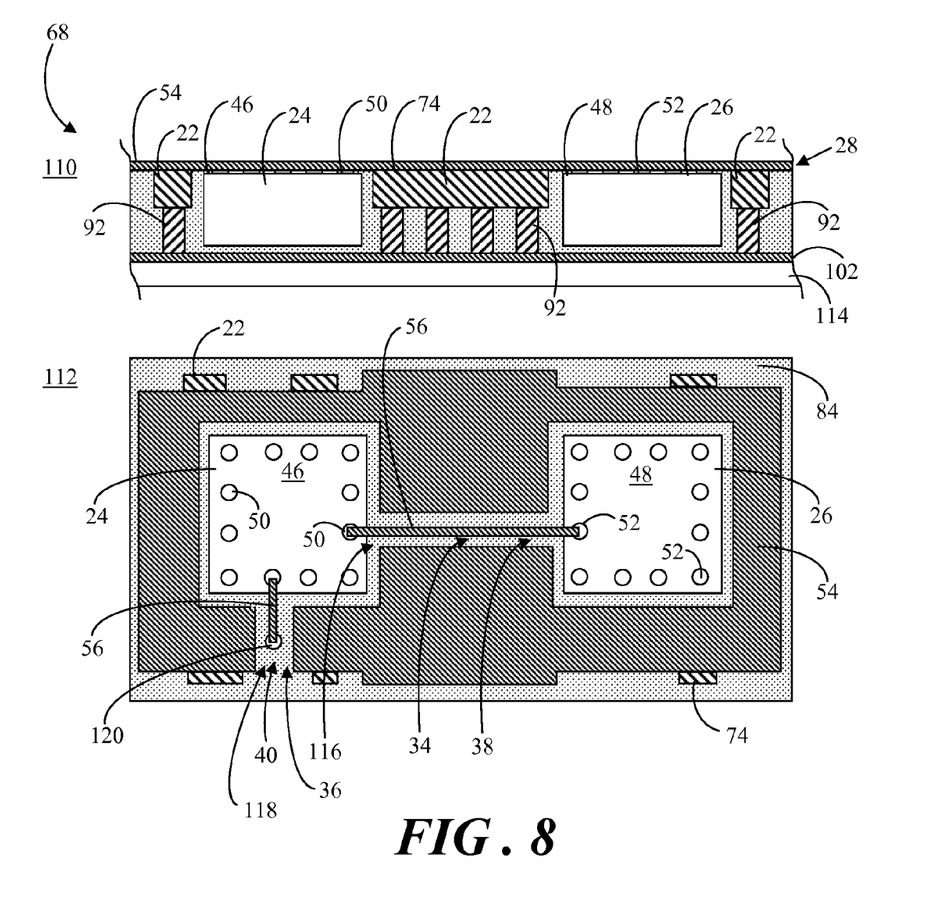
FIG. 8 shows a cross-sectional side view and a top view of the panel shown in FIG. 7 further along in processing.

Referring to FIG. 8 in connection with task 108, FIG. 8 shows a cross-sectional side view 110 and a top view 112 of panel 68 shown in FIG. 7 further along in processing. As shown, panel 68 has been placed on a carrier 114 such that outer surface 74 of ground plane 22, active surface 46 of device 24, and active surface 48 of device 26 are facing upward. In addition, metallization layer 54, as the first layer of build-up layers 28, is formed overlying and in direct contact with outer surface 74 of at least a portion of ground plane 22. Electrical interconnects 56 are formed in connection with the deposition of metallization layer 54. Metallization layer 54 and electrical interconnects 56 are concurrently formed using any suitable process that selectively deposits, patterns, and etches the material to produce metallization layer 54 overlying outer surface 74 of ground plane 22, while exposing active surface 46 of device 24 and active surface 48 of device 26, and to produce electrical interconnects 56.

Metallization layer 54 includes a passage region 116 and a passage region 118 at which the material of metallization layer 54 is absent. Passage region 116 is in stacked alignment with transmission line cutout 34 and passage region 118 is in stacked alignment with transmission line cutout 36. That is, packaging material 84 underlies passage regions 116 and 118. However, ground plane 22 is does not underlie these passage regions 116 and 118. In an embodiment, passage region 116 in combination with transmission line cutout 34 defines critical signal pathway 38. Similarly, passage region 118 in combination with transmission line cutout 36 defines critical signal pathway 40.

One or more of devices 24 and 26 within IC module 20 may be high frequency devices, such as a millimeter-wave device. In an embodiment, electrical interconnects 56 represent critical signal traces that are adapted to carry a high frequency signal, such as a millimeter-wave signal between devices 24 and 26 or to other devices (not shown). Thus, critical signal pathways 38 and 40 provide a protected environment for placement of high frequency signal traces, in this example, electrical interconnects 56, so as to improve high frequency signal line performance. In addition, the implementation of critical signal pathways 38 and 40 improves attenuation, eliminates discontinuity issues, and provides a platform for guided interconnection signal paths.

In the exemplary embodiment, one of electrical interconnects 56 positioned in critical signal pathway 38 interconnects one of conductive pads 50 of device 24 with one of conductive pads 52 of device 26. As exemplified by electrical interconnect 56 positioned in critical signal pathway 40, electrical interconnects 56 need not connect directly to another device, but may instead connect to input/output elements or other devices by way of a conductive via 120, traces, and the like formed in packaging material 84 or in build-up layers 28. Those skilled in the art will recognize that metallization layer 56, critical signal pathways 38 and 40, and associated passage regions 116 and 118, and cutouts 34 and 36 can take various forms in accordance with a particular design of IC module 20. As such, electrical interconnects 56, pads 50 and 52, and conductive via 120 as illustrated in FIG. 8 are merely examples of interconnects that may be formed. In addition, non-critical signal lines, i.e., those that carrier lower frequency signals (not shown), can be distributed between vias and the patterned metallization of build-up layers 28 (FIG. 1) in accordance with particular design requirements of IC module 20 during task 108 of IC module packaging process 60 (FIG. 2).

With reference back to FIG. 2, IC module packaging process 60 continues with a task 122. Following the formation of build-up layers 28 (FIG. 1) and electrical interconnects 56 over active surfaces 46 and 48 of devices 24 and 26, panel 68 is removed from carrier 114 at task 122.

Next, a task 124 is performed. At task 124, panel 68 is separated into individual IC modules 20. For example, panel 68 may be diced, or singulated, in accordance with dicing lines 66 (FIG. 2) shown in connection with ground plane 22 (FIG. 2) to form individual IC modules 20. IC module packaging process 60 exits following task 124.

Figure 9:
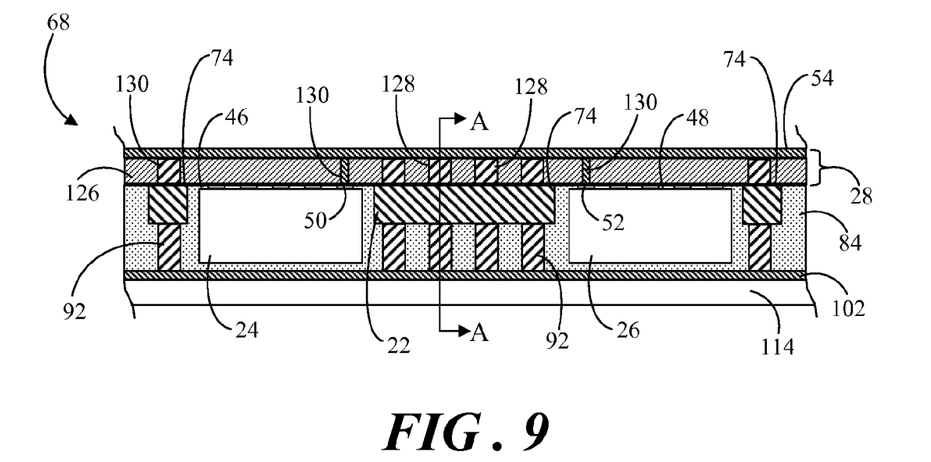
FIG. 9 shows a cross-sectional side view of the panel shown in FIG. 7 further along in processing in accordance with an alternative embodiment of the IC module packaging process.
Figure 10:
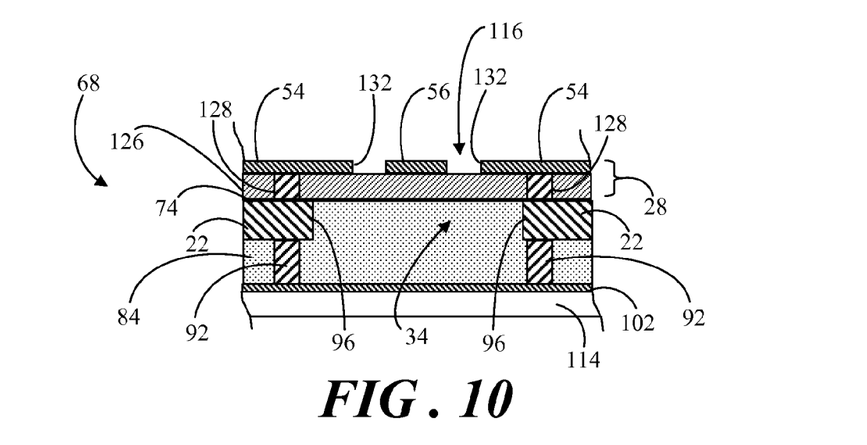
FIG. 10 shows a cross-sectional side view of the panel of FIG. 9 along section lines A-A in FIG. 9.
Figure 11:
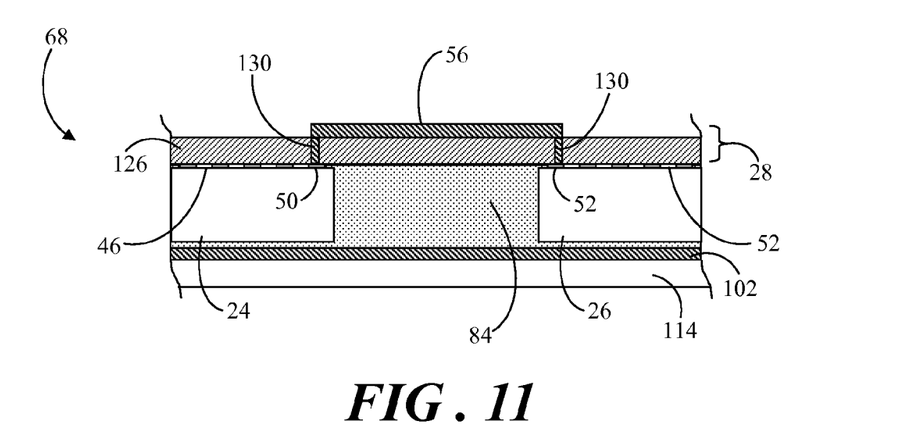
FIG. 11 shows a partial side view of the panel of FIG. 9 illustrating an electrical interconnection of devices within the IC module.

Referring now, to FIGS. 9-11, FIG. 9 shows a cross-sectional side view of panel 68 shown in FIG. 7 further along in processing in accordance with an alternative embodiment of IC module packaging process 60 (FIG. 2). FIG. 10 shows a cross-sectional side view of panel 68 along section lines A-A in FIG. 9, and FIG. 11 shows a partial side view of panel 68 illustrating an electrical interconnection of devices 24 and 26. As shown, panel 68 has been placed on carrier 114 such that outer surface 74 of ground plane 22, active surface 46 of device 24, and active surface 48 of device 26 are facing upward. In addition, build-up layers 28 are formed overlying outer surface 74 of at least a portion of ground plane 22. As mentioned previously above, build-up layers 28 may include one or more dielectric layers and one or more overlying circuit metal layers within which traces may be formed. Interconnects may thus be routed or redistributed among the one or more build-up layers 28 to minimize the area of IC module 20. The structure shown in FIGS. 9-11 may result from the execution of task 108 (FIG. 2) of IC module packaging process 60 (FIG. 2).

In the embodiment of FIGS. 9-11, metallization layer 54 and interconnects 56 do not lie in direct contact with outer surface 74 of ground plane 22 and particular pads 50 and 52 of devices 24 and 26. Rather, a dielectric layer 126, as a layer of build-up layers 28, is formed overlying and in direct connect with outer surface 74 of at least a portion of ground plane 22, as well as, at least portions of active surface 46 of device 24 and active surface 48 of device 26. Interconnects (not shown) may be formed in dielectric layer 126 to other metallization layers (not shown) of build-up layers 28 and/or to external sources (not shown). Dielectric layer 126 is formed using any suitable process that selectively deposits, patterns, and etches the material in accordance with particular design requirements.

In accordance with the deposition, patterning, and etching of dielectric layer 126, vias 128 and 130 may be formed through dielectric layer 126. By way of example, via-holes are formed by patterning and etching dielectric layer 126. The via-holes are then filled with a conductive material, such as copper, to form vias 128 and 130. Accordingly, vias 128 and 130 refer to conductor-filled via-holes, which are referred to hereinafter as conductive vias 128 and conductive vias 130. The conductive material can be deposited using any suitable process (e.g., chemical vapor deposition (CVD), atomic layer deposition (ALD), plating, and the like) to fill the via-holes.

In an embodiment, conductive vias 128 extend between outer surface 74 of ground plane 22 and metallization layer 54. Thus, conductive vias 128 electrically interconnect metallization layer 54 with ground plane 22. Some of conductive vias 128 may be aligned on opposing longitudinal sides 96 of transmission cutout 34 and extend to opposing edges 132 of passage region 116 of metallization layer 54. Likewise, some of conductive vias 128 may be aligned on opposing longitudinal sides 98 (FIG. 6) of transmission cutout 34 (FIG. 6) and extend to opposing edges (not visible) of passage region 118 (FIG. 8) of metallization layer 54. Still others of conductive vias 128 may be formed in dielectric layer 126 surrounding devices 24 and 26, for example, as shown in FIG. 6. Thus, conductive vias 128 perform a shielding function like that discussed in connection with conductive vias 92 (FIG. 6). Moreover, conductive vias 128 may function in cooperation with ground plane 22 for internal electrical partition of IC module 20 and for guiding critical high frequency signals via critical signal pathways 38 and 40 (FIG. 1).

As most clearly visualized in FIGS. 9 and 11, one of conductive vias 130 extends between one of pads 50 on active surface 46 of device 24 and one of electrical interconnects 56. Another of conductive vias 130 extends between one of pads 52 on active surface 48 of device 26 and the one of electrical interconnects 56. Thus, conductive vias 130 provide electrical interconnection through dielectric layer 126 between pads 50 and 52 and electrical interconnect 56.

The embodiment of FIGS. 9-11 yields IC module 20 with critical signal pathways that provide a protected environment for placement of high frequency signal traces, in this example, electrical interconnects 56, so as to improve high frequency signal line performance even in the presence of the intervening dielectric layer 126. The protected environment is produced by the addition of vias 128 through dielectric layer 126 in a generally similar orientation as vias 92 through packaging material 84.

An embodiment described herein comprises an IC module having one or more high frequency devices integrated therein. Another embodiment described herein comprises a method for packaging an IC module that includes one or more high frequency devices operating at, for example, millimeter wave, microwave, or radiofrequency wave frequencies. The methodology employs a relatively low cost chips-first packaging technology that incorporates a pre-patterned ground plane and devices embedded in the packaging material of the IC module. The methodology further entails the formation of conductive vias within the packaging material and electrically connected with the ground plane. The conductive vias are strategically placed to protect against electromagnetic interference and to provide guided signal paths for high frequency signals so as to enhance performance of the IC module.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of making an integrated circuit (IC) module comprising:

attaching an outer surface of a ground plane to a process carrier, said ground plane having a first cutout and a second cutout, each of said first and second cutouts extending through said ground plane, said second cutout having a first end and a second end, said first end adjoining said first cutout, and said second cutout forming a critical signal pathway;

coupling a first surface of a first device to said process carrier, said first device being positioned in said first cutout;

fastening a second surface of a second device to said process carrier, said second device being positioned outside of said first cutout and adjacent to said second end of said second cutout;

encapsulating said ground plane, said first device, and said second device in a packaging material, such that said outer surface, said first surface, and said second surface are exposed out of said packaging material; and forming an electrical interconnect positioned in said critical signal pathway to produce said IC module, said electrical interconnect interconnecting said first device with said second device.

2. A method as claimed in claim 1 further comprising forming a metallization layer overlying at least a portion of said outer surface of said ground plane to include a passage region at which said metallization layer is absent, said passage region being in stacked alignment with said second cutout, wherein together said second cutout and said passage region define said critical signal pathway.

3. A method as claimed in claim 2 further comprising removing said process carrier to expose said outer surface, said first surface, and said second surface, said metallization layer being formed following removal of said process carrier.

4. A method as claimed in claim 2 wherein said metallization layer and said electrical interconnect are formed concurrently.

5. A method as claimed in claim 2 wherein said metallization layer and said electrical interconnect are formed on a coincident plane.

6. A method as claimed in claim 2 further comprising:

forming a dielectric layer interposed between said outer surface of said ground plane and said metallization layer; and forming conductive vias aligned on opposing longitudinal sides of said second cutout, said conductive vias extending between said ground plane and said metallization layer through said dielectric layer.

7. A method as claimed in claim 1 further comprising forming conductive vias in said packaging material surrounding at least one of said first cutout and said second cutout, said conductive vias extending between said ground plane and an exterior surface of said packaging material.

8. A method as claimed in claim 7 further comprising forming a metallization layer on said exterior surface of said packaging material and in electrical communication with said conductive vias.

9. A method as claimed in claim 7 wherein said first device is a millimeter-wave device positioned in said first cutout, said electrical interconnect is a critical signal trace adapted to carry a millimeter-wave signal between said millimeter-wave device and said second device, and said forming said conductive vias forms said vias to surround at least one of said millimeter-wave device and said critical signal trace.

10. A method as claimed in claim 1 wherein said ground plane includes a third cutout extending through said ground plane, said second end of said second cutout adjoins said third cutout, and said method further comprises positioning said second device in said third cutout.

11. A method as claimed in claim 10 further comprising forming conductive vias in said packaging material surrounding said third cutout, said conductive vias extending between said ground plane and an exterior surface of said packaging material.

12. A method as claimed in claim 1 further comprising removing said process carrier to expose said outer surface, said first surface, and said second surface, said electrical interconnect being formed following removal of said process carrier.

13. A method as claimed in claim 1 wherein said forming said electrical interconnect comprises interconnecting a first conductive pad on said first surface of said first device with a second conductive pad on said second surface of said second device.

14. A method of making an integrated circuit (IC) module comprising:
attaching an outer surface of a ground plane to a process carrier, said ground plane having a first cutout and a second cutout, each of said first and second cutouts extending through said ground plane, said second cutout having a first end and a second end, said first end adjoining said first cutout;
coupling a first surface of a first device to said process carrier, said first device being positioned in said first cutout;
fastening a second surface of a second device to said process carrier, said second device being positioned outside of said first cutout and adjacent to said second end of said second cutout;
encapsulating said ground plane, said first device, and said second device in a packaging material, such that said outer surface, said first surface, and said second surface are exposed out of said packaging material;
forming conductive vias in said packaging material surrounding at least one of said first cutout and said second cutout, said conductive vias extending between said ground plane and an exterior surface of said packaging material;
forming a metallization layer overlying at least a portion of said outer surface of said ground plane to include a passage region at which said metallization layer is absent, said passage region being in stacked alignment with said second cutout, wherein together said second cutout and said passage region define a critical signal pathway; and
forming an electrical interconnect positioned in said critical signal pathway to produce said IC module, said electrical interconnect interconnecting said first device with said second device.

15. A method as claimed in claim 14 wherein said metallization layer is a first metallization layer, and said method further comprises forming a second metallization layer on said exterior surface of said packaging material and in electrical communication with said conductive vias such that said ground plane, said first device, and second device are interposed between said first and second metallization layers.

16. A method as claimed in claim 14 wherein said first device is a millimeter-wave device positioned in said first cutout, said electrical interconnect is a critical signal trace adapted to carry a millimeter-wave signal between said millimeter-wave device and said second device, and said forming said conductive vias forms said vias to surround at least one of said millimeter-wave device and said critical signal trace.

17. A method as claimed in claim 14 wherein said ground plane includes a third cutout extending through said ground plane, said second end of said second cutout adjoining said third cutout, and said method further comprises positioning said second device in said third cutout, and said forming said conductive vias forms said vias to additionally surround said second device.

18. A method of making an integrated circuit (IC) module comprising:
attaching an outer surface of a ground plane to a process carrier, said ground plane having a first cutout and a second cutout, each of said first and second cutouts extending through said ground plane, said second cutout having a first end and a second end, said first end adjoining said first cutout;
coupling a first surface of a first device to said process carrier, said first device being positioned in said first cutout;
fastening a second surface of a second device to said process carrier, said second device being positioned outside of said first cutout and adjacent to said second end of said second cutout;
encapsulating said ground plane, said first device, and said second device in a packaging material, such that said outer surface, said first surface, and said second surface are exposed out of said packaging material;
forming a first metallization layer on said exterior surface of said packaging material;
forming a second metallization layer overlying at least a portion of said outer surface of said ground plane such that said ground plane, said first device, and said second device are interposed between said first and second metallization layers, said second metallization layer including a passage region at which said second metallization layer is absent, said passage region being in stacked alignment with said second cutout, wherein together said second cutout and said passage region define a critical signal pathway; and
forming an electrical interconnect positioned in said critical signal pathway to produce said IC module, said electrical interconnect interconnecting said first device with said second device.

19. A method as claimed in claim 18 further comprising:
forming a dielectric layer interposed between said outer surface of said ground plane and said second metallization layer; and
forming conductive vias aligned on opposing longitudinal sides of said second cutout, said conductive vias extending between said ground plane and said second metallization layer through said dielectric layer.

20. A method as claimed in claim 19 wherein said conductive vias are first conductive vias, and said method further comprises forming second conductive vias in said packaging material surrounding at least one of said first cutout and said second cutout, said second conductive vias extending between said ground plane and said first metallization layer.

* * * * *